United States Patent
Gardner et al.

(10) Patent No.: US 7,202,648 B2
(45) Date of Patent: Apr. 10, 2007

(54) FULLY INTEGRATED DC-TO-DC REGULATOR UTILIZING ON-CHIP INDUCTORS WITH HIGH FREQUENCY MAGNETIC MATERIALS

(75) Inventors: Donald S. Gardner, Mountain View, CA (US); Volkan Kursun, Rochester, NY (US); Siva Narendra, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/430,627

(22) Filed: May 5, 2003

(65) Prior Publication Data

US 2004/0222773 A1    Nov. 11, 2004

(51) Int. Cl.
*G05F 1/40* (2006.01)
*H01L 29/00* (2006.01)

(52) U.S. Cl. .................. 323/282; 257/528; 438/329
(58) Field of Classification Search ........... 363/75, 363/24, 90, 81, 97, 98, 68, 28, 89; 323/282, 323/285; 336/200, 232, 192, 180; 257/531, 257/528, 773, 379; 438/381, 243, 329
See application file for complete search history.

(56) References Cited

U.S. PATENT DOCUMENTS

| | | | | |
|---|---|---|---|---|
| 4,455,545 A | * | 6/1984 | Shelly | 336/200 |
| 4,553,199 A | * | 11/1985 | Harada et al. | 363/75 |
| 5,559,360 A | * | 9/1996 | Chiu et al. | 257/531 |
| 6,291,305 B1 | | 9/2001 | Huang et al. | |
| 6,429,632 B1 | * | 8/2002 | Forbes et al. | 323/282 |
| 6,452,247 B1 | * | 9/2002 | Gardner | 257/528 |
| 6,531,945 B1 | * | 3/2003 | Ahn et al. | 336/200 |
| 2003/0005572 A1 | | 1/2003 | Gardner | |
| 2003/0006474 A1 | | 1/2003 | Gardner | |

OTHER PUBLICATIONS

United States Patent Application entitled Integrated Inductor, Inventor: Donald S. Gardner.
United States Patent Application entitled Integrated Transformer, Inventor: Donald S. Gardner.
United States Patent Application entitled Integrated Transformer, Inventor: Donald S. Gardner.

(Continued)

*Primary Examiner*—Rajnikant B. Patel
(74) *Attorney, Agent, or Firm*—Schwegman, Lundberg, Woessner & Kluth, P.A.

(57) ABSTRACT

An fully integrated DC-to-DC switching converter having an inductor, where the inductor has magnetic material that may be amorphous CoZrTa, CoFeHfO, CoAlO, FeSiO, CoFeAlO, CoNbTa, CoZr, and other amorphous cobalt alloys. The magnetic material allows for a relatively high switching frequency. In one embodiment, the inductor has two sub-structures, where each of the two sub-structures are parallel to each other and each includes a conductor having upper and lower portions. The conductors of the two sub-structures are electrically connected to each other, and the upper and lower portions are arranged so that magnetic flux from one of the sub-structures couples with the magnetic flux from the other sub-structure so as to provide a relatively high inductance with small form factor. In another embodiment, the inductor is a simple conductor surrounded by high-frequency magnetic material. In both structures, oxide insulates the conductors from the magnetic material.

9 Claims, 4 Drawing Sheets

OTHER PUBLICATIONS

Shirakawa, K. et al., "Thin Film Cloth-Structured Inductor for Magnetic Integrated Circuit," IEEE Transactions on Magnetics, vol. 26, No. 5 pp. 2262-2264, Sep. 1990.

Matsumoto, S. et al., "Integration of a Power Supply for System-on-Chip," IEICE Transactions on Fundamentals of Electronics, vol. E80-A, No. 2, pp. 276-282, Feb. 1997.

* cited by examiner

US 7,202,648 B2

FULLY INTEGRATED DC-TO-DC REGULATOR UTILIZING ON-CHIP INDUCTORS WITH HIGH FREQUENCY MAGNETIC MATERIALS

FIELD

The present invention relates to voltage regulator circuits, and more particularly, to fully integrated DC-to-DC voltage regulators.

BACKGROUND

The vast majority of voltage regulators (converters) used in high performance electronics may be classified into two basic types: linear and switched regulators. Switched regulators are much more efficient than linear regulators because the pass transistors used in switched regulators do not continuously draw current. The best efficiency achievable with a linear regulator, even assuming ideal (lossless) components, is $V_{out}/V_{in}$, where $V_{out}$ is the regulated output voltage and $V_{in}$ is the input voltage to the voltage regulator. Linear regulators may be a good choice for applications in which the difference between the output voltage $V_{out}$ and the original supply input voltage $V_{in}$ is not too large. But when the regulated voltage is sufficiently less than the input voltage, switched regulators are usually the preferred option, particular where power savings is important.

Switched regulators making use of inductors, such as a Buck switching regulator, can offer an operating efficiency greater than 90%. Presently, such voltage regulators are not fully integrated on the processor die for several reasons. Voltage regulators are usually designed with operating frequencies in a range of 0.1 to 10 MHz. But the inductance needed for switched voltage regulators using inductors operating in this frequency range is too large for an on-chip inductor. Increasing the operating frequency still leads to inductors that are too large for on-chip placement without the use of magnetic material in the inductor. However, magnetic materials are typically not used in high-frequency inductors because their frequency range has to date been limited to much less than 100 MHz.

As processor technology scales to smaller dimensions, supply voltages to circuits within a processor will also scale to smaller values. The power consumption of processors has also been increasing. Using an external power supply or an off-chip voltage regulator to provide a small supply voltage to a processor with a large power consumption will lead to a larger total electrical current being supplied to the processor. This will increase the electrical current per pin, or the total number of pins needed. Currently, the number of pins limits the scaling of ULSI circuits. An increase in supply current can also lead to an increase in resistive voltage drops across various off-chip and on-chip interconnects.

Furthermore, there has been interest in using two different supply voltages in a processor to reduce power consumption and pin count. As an example, a processor may be designed so that high performance circuits within the processor use a higher supply voltage than that used for low performance circuits within the processor. Modeling has shown that at least a 30% savings in power can be achieved by using a dual power supply in a microprocessor. Using one or more off-chip voltage regulators to provide two circuit supply voltages to a processor die can lead to an increase in complexity, pin count, and cost.

Consequently, as technology scales to smaller voltages, and for dual voltage processors, there would be advantages to integrating switched voltage regulators on the die.

DESCRIPTION OF EMBODIMENTS

Figure 1:
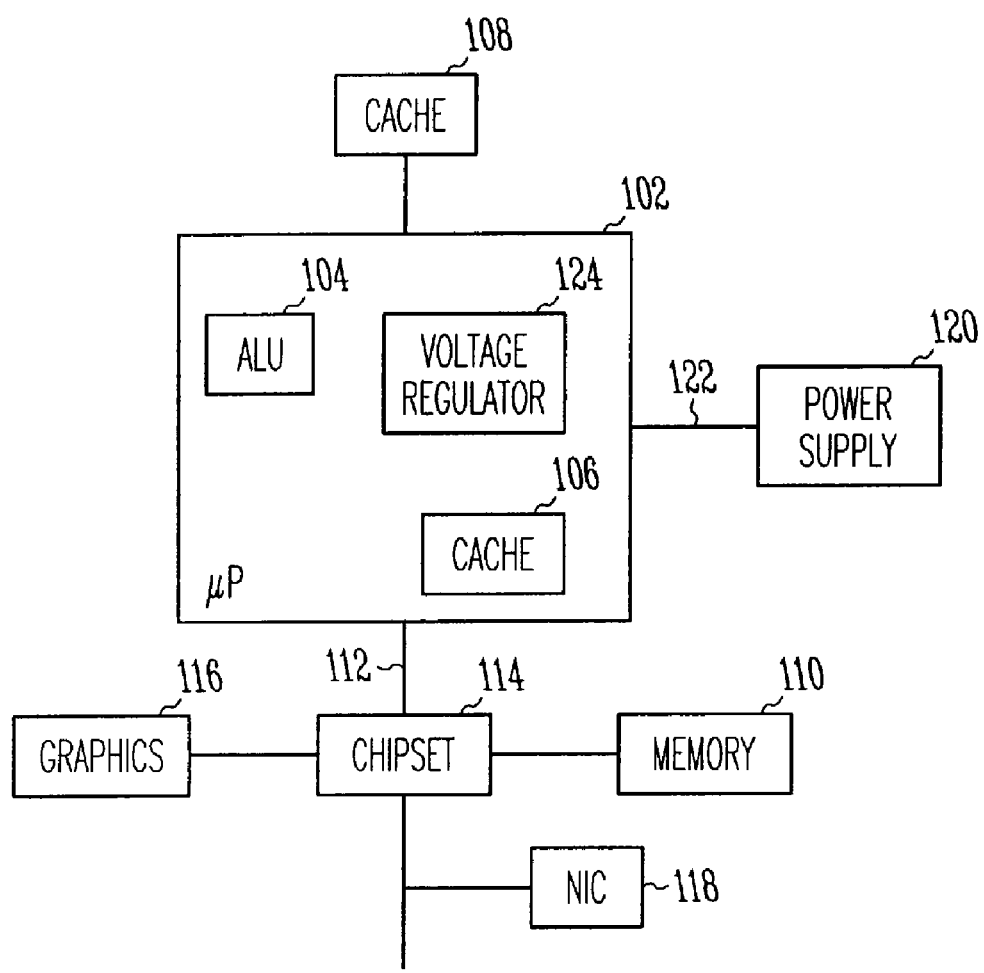
FIG. 1 is a computer system employing an embodiment of the present invention.

Embodiments of the present invention may be integrated on a processor, or used in computer systems, such as that in FIG. 1. In FIG. 1, microprocessor die 102 comprises many sub-blocks, such as arithmetic logic unit (ALU) 104 and on-die cache 106. Microprocessor 102 may also communicate to other levels of cache, such as off-die cache 108. Higher memory hierarchy levels, such as system memory 110, are accessed via host bus 112 and chipset 114. In addition, other off-die functional units, such as graphics accelerator 116 and network interface controller (NIC) 118, to name just a few, may communicate with microprocessor 102 via appropriate busses or ports.

Power supply 120 provides a supply voltage to microprocessor 102 via power bus 122. Power supply 120 may be part of a power distribution system providing power to other modules, but for simplicity such connections are not shown. Embodiments of the present invention are realized in voltage regulator 124.

Figure 2:
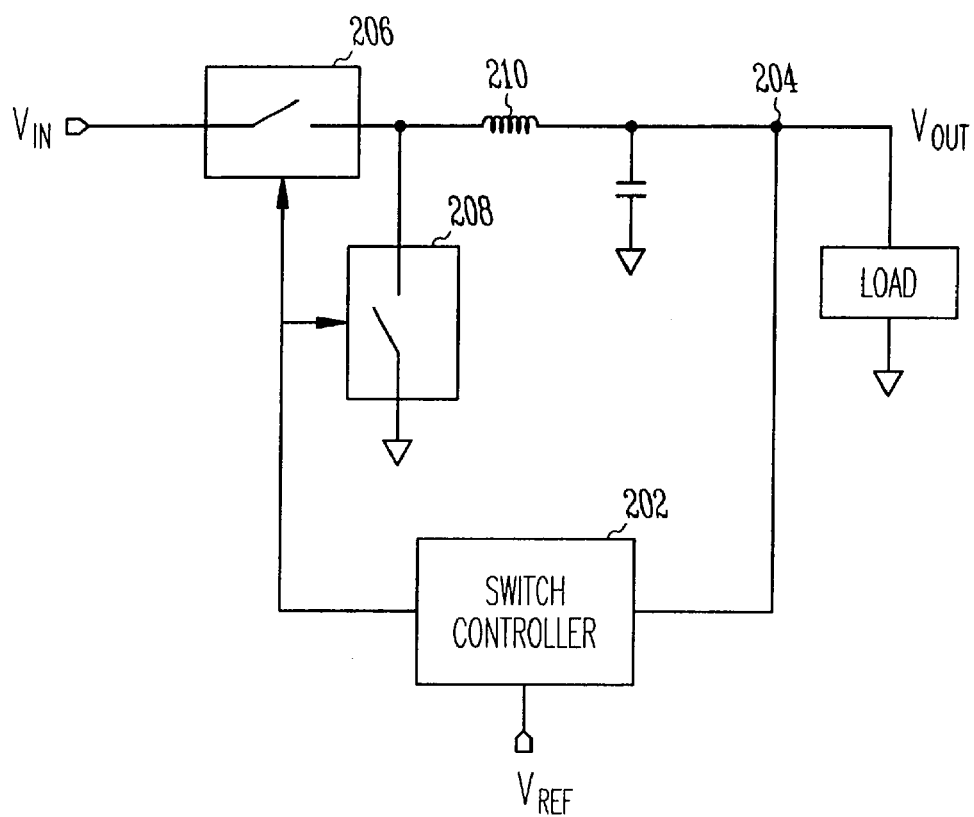
FIG. 2 is a DC-to-DC converter having an inductor according to an embodiment of the present invention.

Regulator 124 is an on-chip DC-to-DC switching regulator comprising an inductor which is switched ON and OFF at a relatively high switching frequency. The switching frequency may be much higher than 100 MHz, and it is expected that embodiments may have switching frequencies greater than 1 GHz. FIG. 2 provides one example of a circuit topology for regulator 124, which is recognized as a Buck converter. Switch controller 202 senses the load voltage at output port 204 and compares it with a reference voltage $V_{ref}$. In response to this comparison, switches 206 and 208 are switched ON and OFF by switch controller 202 at a switching frequency and with a duty factor so as to maintain the sensed output voltage close to $V_{ref}$. Switches 206 and 208 may be realized by field effect transistors.

Inductor 210 comprises magnetic material, such as amorphous CoZrTa, CoFeHfO, CoAlO, FeSiO, CoFeAlO, CoNbTa, CoZr, and other amorphous cobalt alloys. An amorphous alloy used in a particular embodiment may comprise various atomic percentages of its constituent elements. For example, a particular embodiment using the amorphous cobalt alloy CoZrTa may have 4% Zr, 4.5% Ta, with the rest being Co. For some other embodiments using CoZrTa, the range for Zr may be from 3% to 12% and the range for Ta may be from 0% to 10%. Other embodiments may use the cobalt alloy CoFeHfO, with 19.1% Fe, 14.5% Hf, and 22.1% O, or the Cobalt alloy CoFeAlO, with 51.1% Co, 21.9% Fe, and 27% Al. These merely serve as particular examples.

Figure 3:
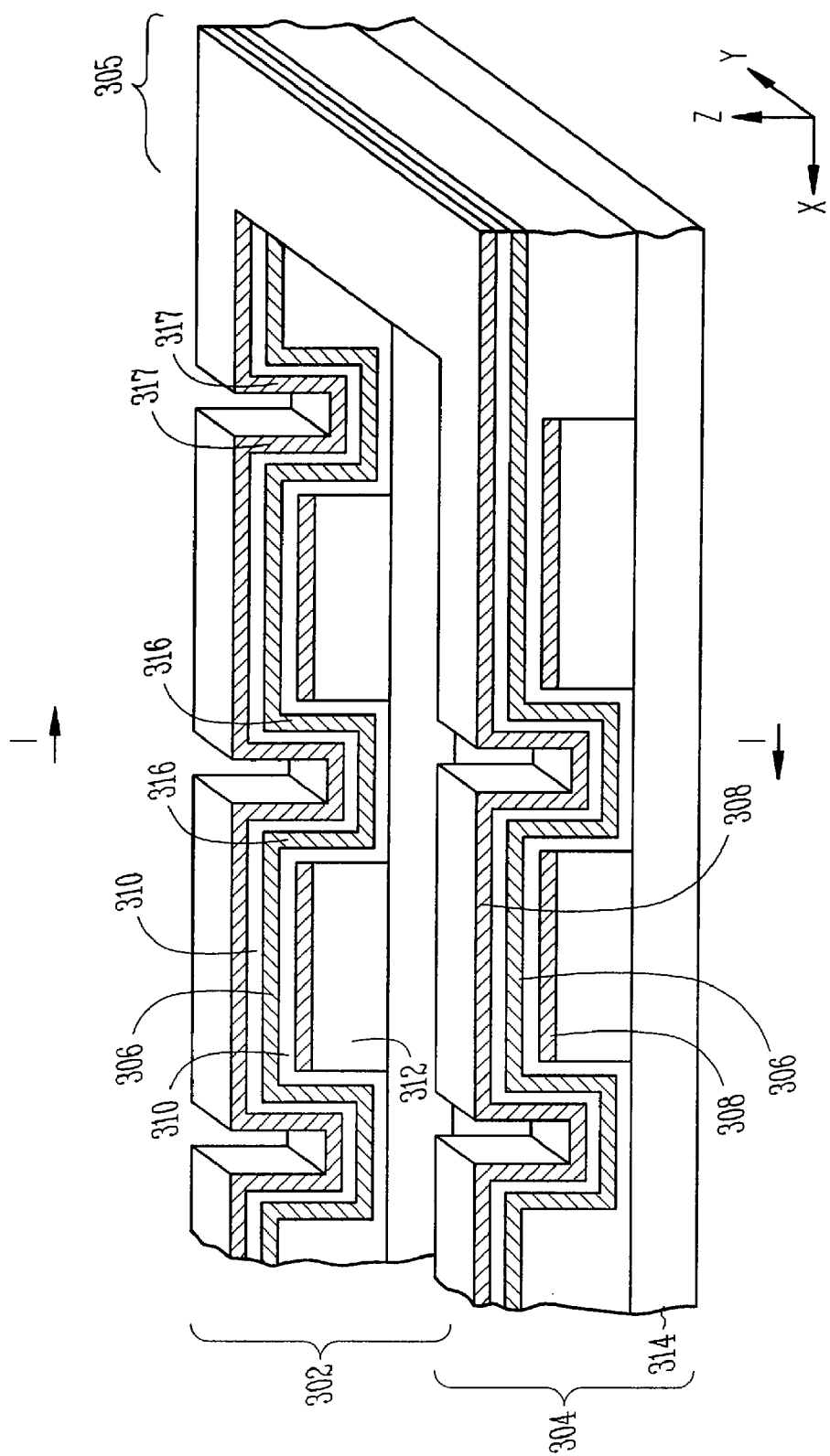
FIG. 3 illustrates the structure of an inductor according to an embodiment of the present invention.

In preferred embodiments, the structure of inductor 210 is such that it has a relatively low resistance. For some embodiments, inductor 210 has a structure shown in FIG. 3. FIG. 3 shows a portion of a low resistance inductor comprising a first sub-structure 302 and a second sub-structure 304. These sub-structures are substantially parallel to each other, and each comprises a conductor 306. Above and below conductor 306 are magnetic films 308. Insulating layers 310 are between magnetic films 308 and conductor 306.

For each sub-structure in FIG. 3, conductor 306 and magnetic films 308 may be viewed as comprising "upper" portions and "lower" portions. An upper portion of conductor 306 or magnetic film 310 is that part of conductor 306 or magnetic film 310 substantially parallel to and above insulating pedestals 312. Insulating pedestals 312 are insulating layers deposited above substrate 314. A lower portion of conductor 306 or magnetic film 310 is that part of conductor 306 or magnetic film which is substantially parallel to substrate 314 but not above pedestals 312. For some embodiments, the upper and lower portions of conductor 306 and magnetic film 308 of a sub-structure form a periodic structure.

As seen from FIG. 3, sub-structures 302 and 304 are joined by connecting sub-structure 305, so that conductive layers 306 in substructures 302 and 304 are electrically connected to each other. As a result, DC current flow in sub-structure 302 is opposite in direction to DC current flow in sub-structure 304. For the embodiment of FIG. 3, the upper magnetic layers in sub-structures 302 and 304 are also in physical contact via connecting sub-structure 305, but may not be for other embodiments. Within sub-structures 302 and 304, FIG. 3 shows the upper and lower portions of conductor 306 connected to each other by "vertically" oriented conductors 316. In practice, the upper and lower portions of conductor 306 may be electrically connected by vias. In another embodiment, the upper and lower portions of conductor 306 may be electrically connected by conductive layers arranged in a stepped manner over pedestals 312. The vertically oriented conductors 316 in FIG. 3 are meant to pictorially represent these and other methods by which the upper and lower portions of conductor 306 are in electrical contact, and it is to be understood that reference to "vertical conductor" is meant to include reference to a conductor formed by vias, a conductor that is stepped, or a conductor of other shape formed by processing techniques to connect upper and lower portions of the conductor.

Similarly, FIG. 3 shows the upper and lower portions of upper magnetic film 310 connected by vertically oriented magnetic films 317. As stated with respect to vertical conductors 316, vertically oriented magnetic films 317 may be referred to as vertical magnetic films and may represent structures that are stepped, as well other structures formed by processing techniques to connect upper and lower portions of upper magnetic film 310.

Insulating pedestals 312 for two adjacent sub-structures are arranged so that the insulating pedestals in one sub-structure are not aligned with the insulating pedestals of the other sub-structure. As a result, the upper (lower) portions of the conductor and magnetic film of one sub-structure are not aligned with the upper (lower) portions of the conductor and magnetic film of the other sub-structure. This arrangement allows for an increase in inductance. To discuss this further, define a trench as that region bounded by two adjacent vertical magnetic films 317 and the lower portion of the magnetic film 310 therebetween. The arrangement of alternating pedestals and trenches in a sub-structure, in which the trenches of one sub-structure align with the pedestals of an adjacent sub-structure, allows for the magnetic flux along the trenches of one sub-structure to align with the magnetic flux through the pedestals of an adjacent sub-structure. This alignment of flux increases the inductance. The structure of FIG. 3 is also described in U.S. Pat. No. 6,452,247.

It is found that integrated inductors according to the embodiment of FIG. 3 having wide lines with magnetic material can provide an inductance in the 5 to 100 pH range. Inductances in this range can be used in switching regulators that switch in the 10 MHz to 1 GHz range. With a structure that has a relatively wide width compared to length, the resistance of inductor of FIG. 3 may be made relatively small. For some embodiments, but not all, the conductors and magnetic material may be approximately 200 microns long and 1 mm wide, the distance between two adjacent sub-structures may be approximately 20 microns, the thickness of the conductor and magnetic material is approximately 1 to 2 microns, and the height (depth) of a pedestal (trench) is approximately 2 to 4 microns.

Figure 4:
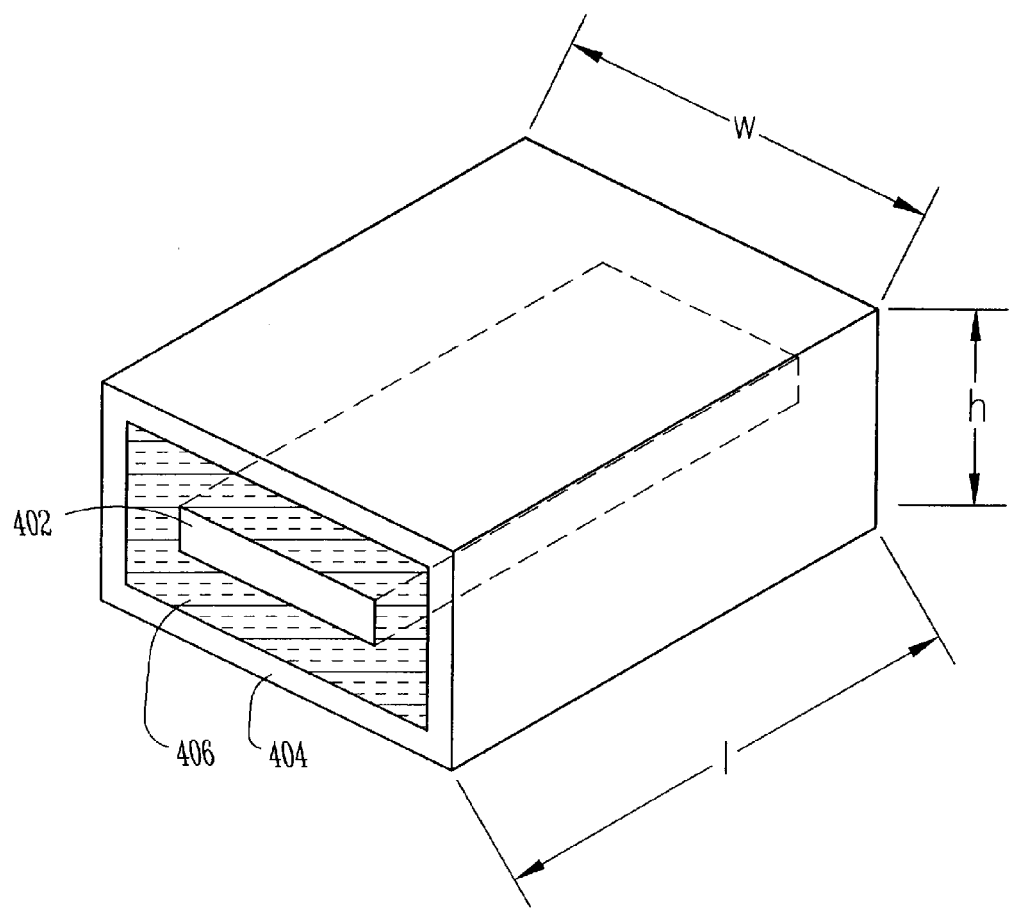
FIG. 4 illustrates another structure of an inductor according to an embodiment of the present invention.

Other embodiments may be realized by utilizing inductors with various structures. For example, an integrated inductor is shown in FIG. 4 which has a simpler structure than that of FIG. 3. A simple, wide line conductor 402 is surrounded by high-frequency magnetic material 404. An oxide 406 immediately surrounds conductor 402 and insulates conductor 402 from magnetic material 404. That is, the top, bottom, and sides of conductor 402 are surrounded by oxide 406 and high-frequency magnetic material 404, whereas the edges of conductor 402 are available for connection to interconnects, not shown. Magnetic material 404 is chosen from the same set of high-frequency materials as discussed for FIG. 3. Other embodiments may not need oxide 406. For example, magnetic material may immediately surround conductor 402 if the magnetic material itself is insulated from other conductors, or if the magnetic material is itself an insulator.

Typical dimensions for the structure of FIG. 4 are 100 microns for the overall width w, 1 mm for the overall length l, and 8 microns for the height h. A typical thickness for magnetic material 404 and conductor 402 is 2 microns. These dimensions merely serve as an example, and other embodiments may have different dimensions.

Various modifications may be made to the disclosed embodiments without departing from the scope of the invention as claimed below. For example, the integrated DC-to-DC switching regulator need not be on the same die as microprocessor 102, but may be integrated on another die with interconnects to the microprocessor die. Furthermore, it is to be understood in these letters patent that the phrase "A is connected to B" means that A and B are directly connected to each other by way of an interconnect, such as metal or polysilicon. This is to be distinguished from the phrase "A is coupled to B", which means that the connection between A and B may not be direct. That is, there may be an active device or passive element between A and B.

What is claimed is:

1. A die comprising:
    an inductor comprising magnetic material selected from the group consisting of amorphous CoZrTa, CoFeHfO, CoAlO, FeSiO, CoFeAlO, CoNbTa, CoZr, and other amorphous cobalt alloys;
    a switch to energize the inductor; and
    a switch controller to switch the switch ON and OFF at a frequency and with a duty cycle, wherein the frequency is greater than 100 MHz,
    wherein the inductor further comprises
        a first sub-structure comprising a first conductor, the first conductor comprising upper portions and lower portions; and a second sub-structure in electrical contact with the first conductor and comprising a second conductor, the second conductor comprising upper portions and lower portions;

wherein a magnetic flux due to a DC current flow in the inductor is such that the magnetic flux due to the DC current flow in the lower portions of the first conductor is aligned with the magnetic flux due to the DC current flow in the upper portions of the second conductor, and the magnetic flux due to the DC current flow in the upper portions of the first conductor is aligned with the magnetic flux due to the DC current flow in the lower portions of the second conductor.

2. The die as set forth in claim 1, wherein the frequency is greater than 1 GHz.

3. The die as set forth in claim 1, wherein the magnetic material comprises upper portions deposited above the upper portions of the first and second conductors, and comprises lower portions deposited above the lower portions of the first and second conductors.

4. The die as set forth in claim 1, the inductor further comprising:
 a conductor having a top, a bottom, a first side, and a second side; and
 an oxide immediately surrounding the top, bottom, first and second sides of the conductor;
 wherein the magnetic material surrounds the oxide such that the conductor is insulated from the magnetic material.

5. The die as set forth in claim 1, the inductor further comprising:
 a conductor having a top, a bottom, a first side, and a second side;
 wherein the magnetic material immediately surrounds the top, bottom, first and second sides of the conductor.

6. A die comprising:
 an inductor comprising magnetic material selected from the group consisting of amorphous CoZrTa, CoFeHfO, CoALO, FeSiO, CoFeAlO, CoNbTa, CoZr, and other amorphous cobalt alloys, wherein the inductor further comprises
 a first sub-structure comprising a first conductor, the first conductor comprising upper portions and lower portions; and
 a second sub-structure in electrical contact with the first conductor and comprising a second conductor, the second conductor comprising upper portions and lower portions;
 wherein a magnetic flux due to a DC current flow in the inductor is such that the magnetic flux due to the DC current flow in the lower portions of the first conductor is aligned with the magnetic flux due to the DC current flow in the upper portions of the second conductor, and the magnetic flux due to the DC current flow in the upper portions of the first conductor is aligned with the magnetic flux due to the DC current flow in the lower portions of the second conductor
 a switch to energize the inductor; and
 a switch controller to switch the switch ON and OFF at a frequency and with a duty cycle, wherein the frequency is greater than 100 MHz.

7. The die as set forth in claim 6, wherein the magnetic material comprises upper portions deposited above the upper portions of the first and second conductors, and comprises lower portions deposited above the lower portions of the first and second conductors.

8. A die comprising:
 an inductor comprising magnetic material selected from the group consisting of amorphous CoZrTa, CoFeHfO, CoAlO, FeSiO, CoFeAlO, CoNbTa, CoZr, and other amorphous cobalt alloys, wherein the inductor further comprises
 a first conductor having a top, a bottom, a first side, and a second side;
 an oxide surrounding the top, bottom, first and second sides of the first conductor,
 wherein the magnetic material surrounds the oxide such that the first conductor is insulated from the magnetic material, and
 a second conductor having a top and a bottom, wherein a magnetic flux due to a DC current flow in the inductor is such that the magnetic flux due to the DC current flow in the bottom of the first conductor is aligned with the magnetic flux due to the DC current flow in the top of the second conductor, and the magnetic flux due to the DC current flow in the top of the first conductor is aligned with the magnetic flux due to the DC current flow in the bottom of the second conductor;
 a switch to energize the inductor; and
 a switch controller to switch the switch ON and OFF at a frequency and with a duty cycle, wherein the frequency is greater than 100 MHz.

9. A die comprising:
 an inductor comprising magnetic material selected from the group consisting of amorphous CoZrTa, CoFeHfO, CoAlO, FeSiG, CoFeAlO, CoNbTa, CoZr, and other amorphous cobalt alloys, wherein the inductor further comprises
 a first conductor having a top, a bottom, a first side, and a second side,
 wherein the magnetic material immediately surrounds the top, bottom, first and second sides of the first conductor, and
 a second conductor having a top and a bottom, wherein a magnetic flux due to a DC current flow in the inductor is such that the magnetic flux due to the DC current flow in the bottom of the first conductor is aligned with the magnetic flux due to the DC current flow in the top of the second conductor, and the magnetic flux due to the DC current flow in the top of the first conductor is aligned with the magnetic flux due to the DC current flow in the bottom of the second conductor;
 a switch to energize the inductor; and
 a switch controller to switch the switch ON and OFF at a frequency and with a duty cycle, wherein the frequency is greater than 100 MHz.

* * * * *

UNITED STATES PATENT AND TRADEMARK OFFICE
CERTIFICATE OF CORRECTION

| | |
|---|---|
| PATENT NO. | : 7,202,648 B2 |
| APPLICATION NO. | : 10/430627 |
| DATED | : April 10, 2007 |
| INVENTOR(S) | : Gardner et al. |

It is certified that error appears in the above-identified patent and that said Letters Patent is hereby corrected as shown below:

In column 5, line 40, in Claim 6, delete "CoALO" and insert -- CoAlO --, therefor.

In column 6, line 38 (Approx.), in Claim 9, delete "FeSiG" and insert -- FeSiO --, therefor.

Signed and Sealed this

Twenty-second Day of July, 2008

JON W. DUDAS
*Director of the United States Patent and Trademark Office*